(12) United States Patent
Mai et al.

(10) Patent No.: US 7,880,550 B2
(45) Date of Patent: Feb. 1, 2011

(54) VOLTAGE TRANSLATION USING FEEDBACK TO ADJUST OUTPUT VOLTAGE RANGE

(75) Inventors: Khoi B. Mai, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 12/483,503

(22) Filed: Jun. 12, 2009

(65) Prior Publication Data

US 2010/0315171 A1 Dec. 16, 2010

(51) Int. Cl.
*H03L 7/08* (2006.01)
*H03L 7/099* (2006.01)

(52) U.S. Cl. ............................. 331/17; 331/34; 327/100

(58) Field of Classification Search ...................... 331/8, 331/17, 18, 25, 34; 327/100
See application file for complete search history.

(56) References Cited

U.S. PATENT DOCUMENTS

| | | | |
|---|---|---|---|
| 5,721,504 A | 2/1998 | Sato | |
| 6,765,430 B2 | 7/2004 | Ando | |
| 6,885,234 B2 | 4/2005 | Ando | |
| 7,123,236 B2 | 10/2006 | Ker et al. | |
| 7,498,886 B2 * | 3/2009 | Lin | ............................. 331/16 |

* cited by examiner

*Primary Examiner*—David Mis
(74) *Attorney, Agent, or Firm*—Ingrassia Fisher & Lorenz, P.C.

(57) ABSTRACT

Apparatus are provided for a voltage-controlled oscillator module. A voltage-controlled oscillator module comprises an input node for receiving an input voltage, a voltage-controlled oscillator, and voltage translation circuitry coupled between the input node and the voltage-controlled oscillator. The voltage translation circuitry is configured to generate a control voltage based on the input voltage and the voltage-controlled oscillator generates an oscillating signal at an oscillation frequency in response to the control voltage. Biasing circuitry is coupled to the voltage translation circuitry, and the biasing circuitry is configured to adjust the ratio of the control voltage to the input voltage.

20 Claims, 3 Drawing Sheets

VOLTAGE TRANSLATION USING FEEDBACK TO ADJUST OUTPUT VOLTAGE RANGE

TECHNICAL FIELD

Embodiments of the subject matter described herein relate generally to electronic circuits, and more particularly, embodiments of the subject matter relate to voltage translation circuitry that compensates for effects of component variations.

BACKGROUND

Phase-locked loops (PLLs) are used to generate a signal having a particular oscillation frequency. The oscillating signal is often utilized by another electronic system, for example, as the clock signal for a processor. Many PLLs utilize voltage-controlled oscillators (VCOs) to produce the oscillating signal at a particular frequency based on an applied voltage (or control voltage). The PLLs adjust the voltage applied to the VCO until the frequency of the oscillating signal is equal to the desired frequency. In most systems, the VCO is designed to accommodate a range of possible oscillation frequencies over a predetermined input voltage range.

Many VCOs include a number of transistors or other semiconductor devices suitably configured to create an electronic oscillator. Although the VCO may be designed to accommodate a particular range of oscillation frequencies over a predetermined applied voltage range, process, voltage, and temperature (PVT) variations affect the operating parameters for the components that comprise the VCO, which in turn, affect the range of oscillation frequencies achievable by the VCO over the input voltage range. As a result, the range of oscillation frequencies capable of being achieved by the VCO is reduced (e.g., at the high end and/or the low end of the desired frequency range).

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

For the sake of brevity, conventional techniques related to phase-locked loops, electronic oscillators, analog circuit design, field-effect transistors (FETs), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

Technologies and concepts discussed herein relate to voltage translation circuitry that compensates for process, voltage, temperature (PVT) variations and/or component variations that may otherwise limit the range of oscillation frequencies achievable by a voltage-controlled oscillator (VCO) over a predetermined voltage range. The voltage translation circuitry translates a reference voltage from a forward-path of a phase-locked loop to a corresponding control voltage that is applied to the VCO and controls the oscillation frequency of the VCO. The ratio of the control voltage to the reference voltage is adjusted using a bias voltage feedback in a manner that compensates for PVT variations and/or other component variations, such that the VCO maintains the ability to achieve the desired frequency range over the reference voltage range.

Figure 1:
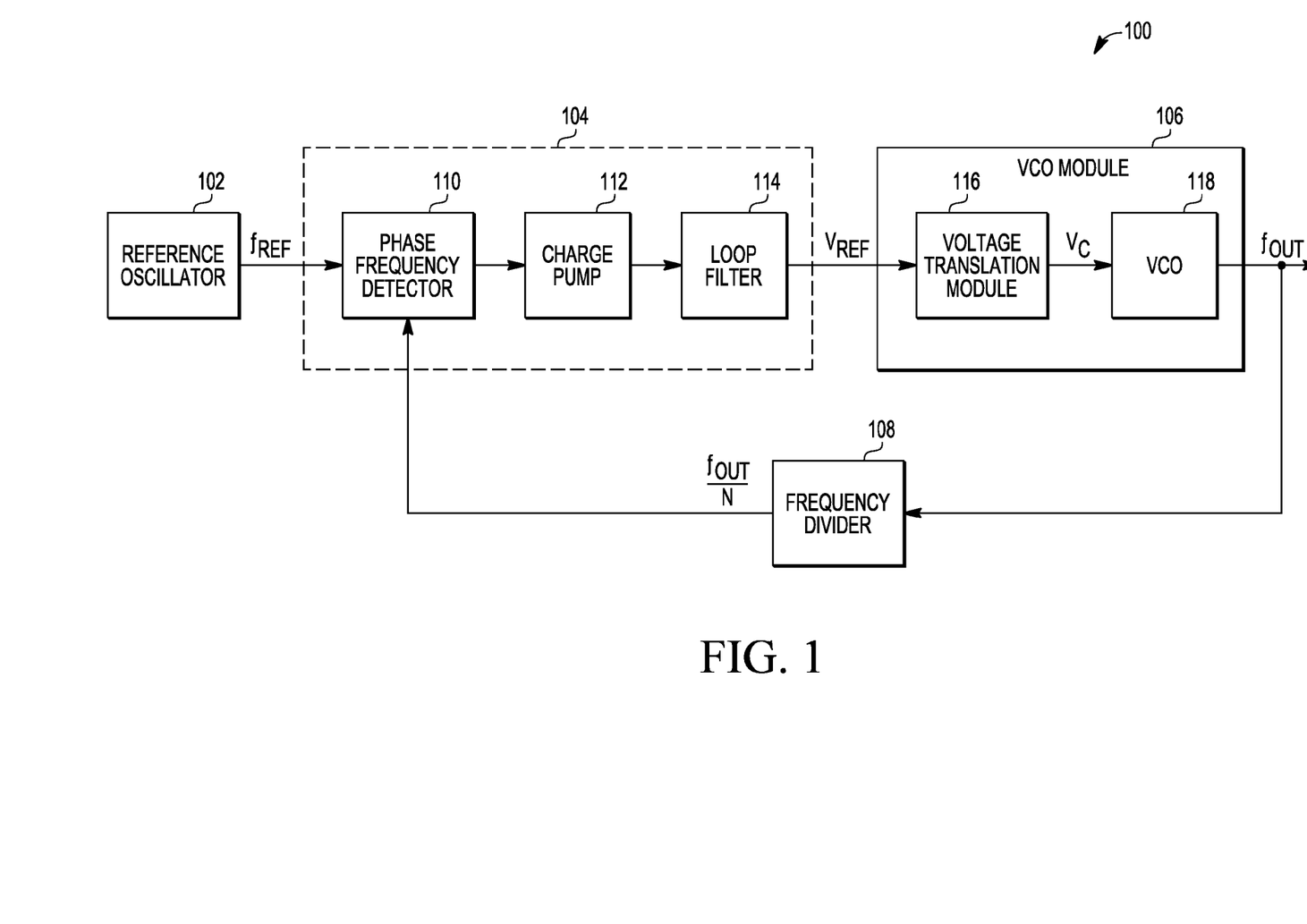
FIG. 1 is a block diagram of a phase-locked loop system in accordance with one embodiment of the invention.

FIG. 1 depicts an exemplary embodiment of a phase-locked loop (PLL) system 100 including, without limitation, a reference oscillator 102, a forward signal path 104, a voltage-controlled oscillator (VCO) module 106, and a frequency divider 108. The elements of the PLL 100 are suitably configured to produce a signal having a desired oscillation frequency ($f_{OUT}$), as described in greater detail below. It should be understood that FIG. 1 is a simplified representation of a PLL 100 for purposes of explanation and ease of description, and that practical embodiments may include other devices and components to provide additional functions and features, and/or the PLL 100 may be part of a much larger electrical system, as will be understood.

In an exemplary embodiment, the reference oscillator 102 is coupled to the forward signal path 104, which in turn is coupled to the VCO module 106. In an exemplary embodiment, the reference oscillator 102 comprises an oscillator, such as, for example, a crystal oscillator, which is configured to generate a reference signal having a fixed reference frequency ($f_{REF}$). The forward signal path 104 compares the reference signal generated by the reference oscillator 102 and a feedback signal from the frequency divider 108 and generates a reference voltage ($V_{REF}$) for the VCO module 106 based on the difference between the reference frequency ($f_{REF}$) and the feedback frequency ($f_{OUT}$/N). As described in greater detail below, the VCO module 106 generates the output signal having a particular oscillation frequency ($f_{OUT}$) that is proportionally related to the reference voltage ($V_{REF}$). The frequency divider 108 is coupled between the output of the VCO module 106 and the forward signal path 104, and the frequency divider 108 is configured to generate or otherwise provide the feedback signal at a frequency that is equal to a factor of the oscillation frequency of the oscillating signal from the VCO module 106 (e.g., $f_{OUT}$/N).

In an exemplary embodiment, the forward signal path 104 comprises a phase frequency detector (PFD) 110, a charge pump 112, and a loop filter 114. The output of the PFD 110 is coupled to the input of the charge pump 112, and the output of the charge pump 112 is coupled to the input of the loop filter 114. The PFD 110 compares the reference signal and the feedback signal and generates an error signal based on the difference between the frequencies and/or phases of the feedback signal and the reference signal. In accordance with one embodiment, the error signal from the PFD 110 comprises an 'up' or 'down' pulse that produces an increase or decrease in the voltage output of the charge pump 112 that is proportional to the duration of the pulse. In an exemplary embodiment, the output of the charge pump 112 has a fixed voltage range, for example, from the ground voltage to another reference voltage (e.g., supply voltage). For example, in some low voltage applications, the voltage output of the charge pump 112 may range from 0 Volts to about 1 Volt. In an exemplary embodiment, the loop filter 114 comprises an analog filter that provides a dominant pole for the PLL 100, thereby ensuring stability for the PLL 100. The loop filter 114 filters the voltage output from the charge pump 112, resulting in the reference voltage ($V_{REF}$). In this manner, forward signal path 104 generates a reference voltage ($V_{REF}$) which varies based on differences (e.g., in frequency and/or phase) between the reference signal and the feedback signal until the feedback signal is in phase-lock with or otherwise matches the reference signal (e.g., $f_{OUT}=N \times f_{REF}$).

In an exemplary embodiment, the VCO module 106 comprises a voltage translation module 116 and a voltage-controlled oscillator (VCO) 118. The voltage translation module 116 performs voltage level translation to generate or otherwise produce a control voltage ($V_C$) for the VCO 118 based on the reference voltage ($V_{REF}$). The VCO 118 comprises an electronic oscillator suitably configured to generate the output signal with an oscillation frequency ($f_{OUT}$) that is proportional to the control voltage ($V_C$). In an exemplary embodiment, the VCO 118 is realized as a ring oscillator or another suitably configured delay oscillator that comprises an odd number of delay cells. In this regard, each delay cell comprises one or more transistors and/or other semiconductor devices, as will be appreciated in the art and described in greater detail below. The voltage translation module 116 generates the control voltage ($V_C$) based on the reference voltage ($V_{REF}$) in a manner that ensures the transistors and/or other semiconductor devices of the VCO 118 are adequately biased and otherwise accommodates operating characteristics of the components that comprise the VCO 118. In this regard, the voltage translation module 116 is designed for a particular ratio of the control voltage ($V_C$) to the reference voltage ($V_{REF}$) that ensures the VCO 118 achieves a desired range of oscillation frequencies ($f_{OUT}$) over the corresponding reference voltage ($V_{REF}$) range. For example, in accordance with one embodiment, to achieve a desired oscillation frequency range of about 2 GHz to about 4 GHz over a reference voltage range from about 0 Volts to 1 Volt, the voltage translation module 116 may be designed to generate the control voltage ranging from about 0.2 Volts to about 0.8 Volts based on the operating characteristics of the VCO 118.

As described in greater detail below, the voltage translation module 116 is configured to utilize feedback to adjust the ratio of the control voltage ($V_C$) to the reference voltage ($V_{REF}$) (or alternatively, the control voltage range) during operation in a manner that compensates for PVT variations and/or other component variations that would otherwise limit the achievable oscillation frequency range for the VCO 118. In this regard, the voltage translation module 116 is self-adjusting, that is, the range of control voltages ($V_C$) generated by the voltage translation module 116 over the reference voltage ($V_{REF}$) range is adjusted (e.g., the ratio of the control voltage ($V_C$) to a particular reference voltage ($V_{REF}$) increases and/or decreases) during operation of the VCO module 106 in a manner that compensates for PVT variations. As a result, the VCO module 106 may achieve the desired range of oscillation frequencies ($f_{OUT}$) over the reference voltage ($V_{REF}$) range regardless of PVT variations and/or other component variations for the VCO 118.

Figure 2:
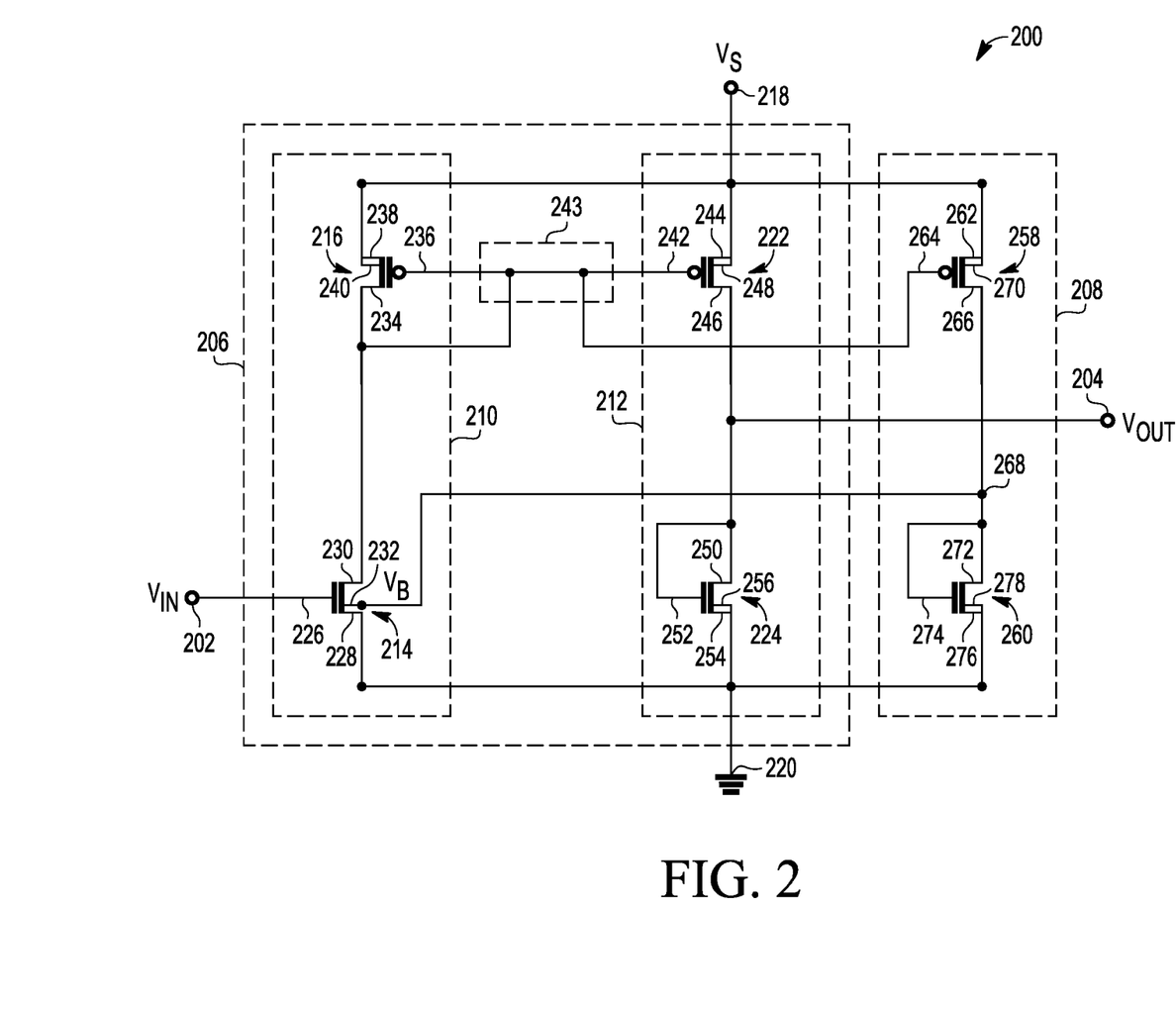
FIG. 2 is a schematic view of a voltage translation module suitable for use in the phase-locked loop system of FIG. 1 in accordance with one embodiment of the invention.

FIG. 2 depicts an exemplary embodiment of a voltage translation module 200 suitable for use as the voltage translation module 116 in the VCO module 106 of FIG. 1. In an exemplary embodiment, the voltage translation module 200 includes, without limitation, an input node 202, an output node 204, voltage translation circuitry 206, and biasing circuitry 208. As described in greater detail below, the voltage translation circuitry 206 is coupled to the input node 202 and the output node 204, and the voltage translation circuitry 206 is configured to produce an output voltage ($V_{OUT}$) at the output node 204 based on an input voltage ($V_{IN}$) at the input node 202 such that an increase in the input voltage ($V_{IN}$) results in a corresponding increase in the output voltage ($V_{OUT}$).

It should be understood that FIG. 2 is a simplified representation of a voltage translation module 200 for purposes of explanation and ease of description, and FIG. 2 is not intended to limit the application or scope of the subject matter in any way. In this regard, it should be noted that although FIG. 2 depicts an implementation using n-type MOSFETs (e.g., NMOS) and p-type MOSFETs (e.g., PMOS), numerous equivalent circuits may be implemented (e.g., using only NMOS or only PMOS). Additionally, although FIG. 2 depicts direct electrical connections between circuit elements and/or terminals, alternative embodiments may employ intervening circuit elements and/or components while functioning in a substantially similar manner.

When used in the PLL 100 of FIG. 1, the voltage at the input node 202 corresponds to the reference voltage ($V_{REF}$) from the forward signal path 104 of the PLL 100 and the voltage at the output node 204 corresponds to the control voltage ($V_C$) provided to the VCO 118, such that the output voltage ($V_{OUT}$) controls the oscillation frequency ($f_{OUT}$) at the output of the VCO 118. In an exemplary embodiment, the voltage translation circuitry 206 is configured such that the ratio of the output voltage ($V_{OUT}$) to the input voltage ($V_{IN}$) to the reference voltage ($V_{REF}$) that ensures the VCO 118 achieves a desired range of oscillation frequencies ($f_{OUT}$) over the input voltage range. As described in greater detail below, the biasing circuitry 208 is coupled to the voltage translation circuitry 206 and increases the ratio of the output voltage ($V_{OUT}$) to the input voltage ($V_{IN}$) in response to the input voltage ($V_{IN}$).

Referring again to FIG. 2, in an exemplary embodiment, the voltage translation circuitry 206 comprises a first transistor stack 210 coupled to the input node 202 (alternatively, the input transistor stack) and a second transistor stack 212 coupled to the output node 204 (alternatively, the output transistor stack). As used herein, "transistor stack," "stacking transistors," "stacked transistors," or equivalents thereof, should be understood to describe the configuration where a terminal of one transistor device is coupled to the a terminal of another transistor device, such that the current passes through the transistor devices in series (e.g., the same current through each transistor device). In an exemplary embodiment, the input transistor stack 210 comprises a first transistor 214 and a second transistor 216 coupled to each other in series between a first reference node 218 and a second reference node 220, that is, the transistors 214, 216 are configured such that current flows between the reference nodes 218, 220 through the channel of each transistor 214, 216 in series. In the illustrated embodiment, the first reference node 218 (alternatively referred to herein as the supply node) is coupled to and/or configured to receive a supply voltage ($V_S$) or otherwise establish a positive reference voltage for the voltage translation module 200, and the second reference node 220 (alternatively referred to herein as the ground node) corresponds to an electrical ground or is otherwise configured to receive or establish a reference potential for the voltage translation module 200.

In the illustrated embodiment of FIG. 2, the output transistor stack 212 comprises a third transistor 222 and a fourth transistor 224 coupled to each other in series between the first reference node 218 and the second reference node 220. The output transistor stack 212 is configured as a current mirror such that the current through the output transistor stack 212 is substantially equal to a ratio of the current through the input transistor stack 210. The ratio of the current through the output transistor stack 212 to the current through the input transistor stack 210 is determined based on characteristics of the transistors 214, 216, 222, 224 that comprise the transistor stacks 210, 212, e.g., based on the ratio of device widths for the transistors 222, 224 of the output transistor stack 212 to the device widths for transistors 214, 216 of the input transistor stack 210, as will be appreciated in the art. In this regard, the ratio of the device widths of the output transistor stack 212 to the device widths of the input transistor stack 210 are configured such that the current through the output transistor stack 212 and/or voltage drop across transistors 222, 224 results in a range in the output voltage ($V_{OUT}$) over a range of the input voltage ($V_{IN}$) that is capable of causing a VCO (e.g., VCO 118) to achieve a desired range of oscillation frequencies over the input voltage range.

In the illustrated embodiment, the first transistor 214 (alternatively referred to as the input transistor) is realized as a NMOS device having a gate terminal 226 coupled to the input node 202, a source terminal 228 coupled to the ground node 220, and a drain terminal 230 coupled to a drain terminal 234 of the second transistor 216. The body terminal 232 (or alternatively, the bulk, base, or substrate terminal) of the input transistor 214 is coupled to the biasing circuitry 208 for receiving a bias voltage ($V_B$), as described in greater detail below. In an exemplary embodiment where the voltage translation module 200 is utilized in a PLL 100 (e.g., as voltage translation module 116), the input transistor 214 is realized as a thick oxide device, that is, a transistor having a gate oxide (or gate insulator) thickness between the gate terminal 226 and channel of the transistor 214 such that little or no gate leakage occurs from the input node 202 to the input transistor 214. In accordance with one or more embodiments, the gate oxide of the input transistor 214 is thicker than the gate oxide of the remaining transistors 216, 222, 224 of the voltage translation module 200. In this regard, in some embodiments, the threshold voltage of the input transistor 214 is greater than the threshold voltages of the remaining transistors 216, 222, 224 of the voltage translation module 200. Reducing and/or eliminating the input gate leakage of the voltage translation module 116, 200 reduces or otherwise minimizes the static phase offset (e.g., the skew between reference signal and the feedback signal when the PLL 100 is in phase-lock) of the PLL 100. In the illustrated embodiment of FIG. 2, the second transistor 216 is realized as a PMOS device having a drain terminal 234 coupled to the drain terminal 230 of the input transistor 214 and a gate terminal 236 coupled to the drain terminal 230 of the input transistor 214. Alternatively, the gate terminal 236 may be referred to as being coupled to the drain terminal 234. The source terminal 238 of the second transistor 216 is coupled to the supply node 218, and the body terminal 240 of the second transistor 216 may be connected to its source terminal 238 and/or the supply node 218 in a conventional manner as shown.

In an exemplary embodiment, the third transistor 222 is realized as a PMOS device having a gate terminal 242 coupled to the gate terminal 236 of the second transistor 216 to create a common gate node 243. In the illustrated embodiment, the voltage at the common gate node 243 is equal to the voltage at the drain terminal 230 of the input transistor 214, or in other words, the voltage at the common gate node 243 is equal to the drain-to-source voltage across the input transistor 214 when the source terminal 228 of the input transistor 214 is connected to the ground node 220. The third transistor 222 also includes a source terminal 244 coupled to the supply node 218 and a drain terminal 246 that is coupled to the output node 204. The body terminal 248 of the second transistor 222 may be connected to its source terminal 244 in a conventional manner as shown. The fourth transistor 224 is realized as a NMOS device having a drain terminal 250 coupled to the output node 204 and a gate terminal 252 coupled to the output node 204. Alternatively, the gate terminal 252 may be referred to as being coupled to the drain terminal 250. The source terminal 254 is coupled to the ground node 220 and the body terminal 256 of the fourth transistor 224 may be connected to its source terminal 254, or alternatively, the ground node 220.

In the embodiment of FIG. 2, the biasing circuitry 208 comprises a biasing transistor stack including a fifth transistor 258 and a sixth transistor 260 configured in series between the supply node 218 and the ground node 220. In an exemplary embodiment, the biasing transistor stack 208 is configured as a current mirror such that the current through the biasing transistor stack 208 is substantially equal to a ratio of the current through the input transistor stack 210 in a similar manner as set forth above in regards to the output transistor stack 212. In the illustrated embodiment, the fifth transistor 258 is realized as a PMOS device having a source terminal 262 coupled to the supply node 218 and a gate terminal 264 coupled to the common gate node 243. Alternatively, the gate terminal 264 may be referred to as being coupled to the gate terminal 236 of the second transistor 216, the gate terminal 242 of the third transistor 222, or the drain terminal 230 of the input transistor 214. The drain terminal 266 of the fifth transistor 258 is coupled to the body terminal 232 of the input transistor 214 at a bias node 268. The body terminal 270 of the fifth transistor 258 may be connected to its source terminal 262 as shown. The sixth transistor 260 is realized as a NMOS device having a drain terminal 272 coupled to the bias node 268, a gate terminal 274 coupled to the bias node 268, and a source terminal 276 coupled to the ground node 220. Alternatively, the gate terminal 274 may be referred to as being coupled to the drain terminal 272 of the sixth transistor 260 or the drain terminal 266 of the fifth transistor 258. As shown, the body terminal 278 of the sixth transistor 260 may be connected to its source terminal 276 and/or the ground node 220. It should be noted that the biasing circuitry 208 is electrically isolated from the output node 204, such that the biasing circuitry 208 does not affect the output voltage ($V_{OUT}$) at the output node 204.

Still referring to FIG. 2, an input voltage ($V_{IN}$) at the input node 202 that exceeds the threshold voltage of the input transistor 214 causes the input transistor 214 to conduct (or source) current and reduces the voltage at the drain terminal 230 (i.e., by reducing the drain-to-source voltage), which in turn reduces the voltage at the common gate node 243 (e.g., gate terminals 236, 242, 264) and causes current to flow through the input transistor stack 210. When the voltage at the gate terminal 242 of the third transistor 222 is reduced, the third transistor 222 conducts current and increases the voltage at the output node 204 (e.g., by reducing the source-to-drain voltage across the third transistor 222), which in turn, increases the voltage at the gate terminal 252 of the fourth transistor 224 resulting in current flow through the output transistor stack 212. In addition, when the voltage at the gate terminal 264 of the fifth transistor 258 is reduced, the fifth transistor 258 to conducts current and increases the bias voltage at the bias node 268, which in turn, increases the voltage at the gate terminal 274 of the sixth transistor 260 resulting in current flow through the biasing transistor stack 208. It should be noted that in this manner, the output voltage ($V_{OUT}$) and the bias voltage ($V_B$) are dependent on the voltage at the common gate node 243, which in turn is based on voltage drop across the input transistor 214 caused by the input voltage ($V_{IN}$). For example, an increase in the input voltage ($V_{IN}$) reduces the drain-to-source voltage of the input transistor 214, which reduces the voltage at the common gate node 243, which in turn, increases the output voltage ($V_{OUT}$) and the bias voltage ($V_B$), and vice versa. As set forth above, the ratio of the output voltage ($V_{OUT}$) at the output node 204 to the input voltage ($V_{IN}$) (or alternatively, the ratio of the output voltage to the common gate node 243 voltage) will be dependent on the sizing and characteristics of the individual transistors 222, 224. In a similar manner, the ratio of the device widths of the transistors 258, 260 of the biasing transistor stack 208 are configured such that the voltage drop across transistors 258, 260 results in a desired relationship of the bias voltage ($V_B$) at the bias node 268 (or body terminal 232) to the input voltage ($V_{IN}$) (or alternatively, the ratio of the bias voltage to the common gate node 243 voltage).

In an exemplary embodiment, the bias node 268 is connected to or otherwise fed back to the body terminal 232 of the input transistor 214, thereby allowing the biasing circuitry 208 to increase the voltage at the body terminal 232 in response to the input voltage ($V_{IN}$) at the input node 202. In this regard, as set forth above, when the input voltage ($V_{IN}$) exceeds the threshold voltage of the input transistor 214, the bias voltage ($V_B$) at the bias node 268 also increases by a corresponding amount (based on the relationship between the size and/or other characteristics of the transistors 258, 260). This, in turn, increases the voltage at the body terminal 232 which reduces the threshold voltage of the input transistor 214, as will be appreciated in the art. As a result, for the same input voltage ($V_{IN}$), the ratio of the gate-to-source voltage for the input transistor 214 (e.g., the voltage at the gate terminal 226 when the source terminal 228 is grounded) to the threshold voltage of the input transistor 214 is increased, thereby causing the input transistor 214 to conduct a greater amount of current because the difference between the gate-to-source voltage (i.e., input voltage $V_{IN}$) and the threshold voltage is greater. This, in turn, reduces the drain-to-source voltage for the input transistor 214, that is, the voltage at its drain terminal 230 and/or common gate node 243 for the same input voltage ($V_{IN}$). A lower voltage at the common gate node 243 causes the third transistor 222 to conduct more current, which in turn, reduces the source-to-drain voltage of the third transistor 222 and thereby increases the output voltage ($V_{OUT}$) output node 204. In other words, by virtue of the bias voltage ($V_B$) fed back to the body terminal 232 of the input transistor 214, the biasing circuitry 208 increases the ratio of the output voltage ($V_{OUT}$) to the input voltage ($V_{IN}$), thereby causing the voltage translation module 200 to generate a larger output voltage ($V_{OUT}$) for a given input voltage ($V_{IN}$). As a result, the voltage translation module 200 achieves a greater range of output voltages ($V_{OUT}$) over the input voltage range.

Referring now to FIG. 1 and FIG. 2, in accordance with one or more embodiments, the voltage translation module 200 is utilized in the VCO module 106 to compensate for PVT variations of the VCO 118 that would otherwise limit the high-end range of oscillation frequencies achievable by the VCO 118. For example, PVT variations and/or other variations may effect the threshold voltages and/or time constants of the components of the VCO 118, and as a result, for a given control voltage, the VCO 118 may produce an oscillating signal with an oscillation frequency that is less than the intended oscillation frequency for the particular control voltage and/or reference voltage. In other words, the PVT and/or component variations reduce the ratio of the oscillation frequency ($f_{OUT}$) to the control voltage ($V_C$) for the VCO 118, such that a higher reference voltage ($V_{REF}$) would be needed to achieve a given oscillation frequency ($f_{OUT}$) absent the bias voltage feedback described above in the context of FIG. 2. As a result, when the charge pump 112 and/or reference voltage ($V_{REF}$) is limited (e.g., by the supply voltage), the VCO 118 may be unable to achieve the high end of the desired oscillation frequency range at the high end of the reference voltage ($V_{REF}$) range. The biasing circuitry 208 and/or bias voltage ($V_B$) at the body terminal 232 of the input transistor 214 increases the ratio of the output voltage ($V_C$) to the input voltage ($V_{REF}$) for the voltage translation module 116, 200, such that the voltage translation module 116, 200 can generate or otherwise provide a larger range of control voltages to the VCO 118 over the reference voltage range. As a result, the VCO module 106 may achieve the high end of the desired oscillation frequency range in situations where the VCO 118 would otherwise be limited by the ratio of the control voltage to reference voltage established by the voltage translation module 116 absent the biasing circuitry 208. It should be noted that as the control voltage ($V_C$) from the voltage translation module 116, 200 increases for the same reference voltage ($V_{REF}$), the charge pump 112 and/or PLL 100 may compensate for the increased ratio caused by the bias voltage ($V_B$) feedback by lowering the reference voltage ($V_{REF}$) to maintain a desired oscillation frequency for the output of the VCO module 106.

Figure 3:
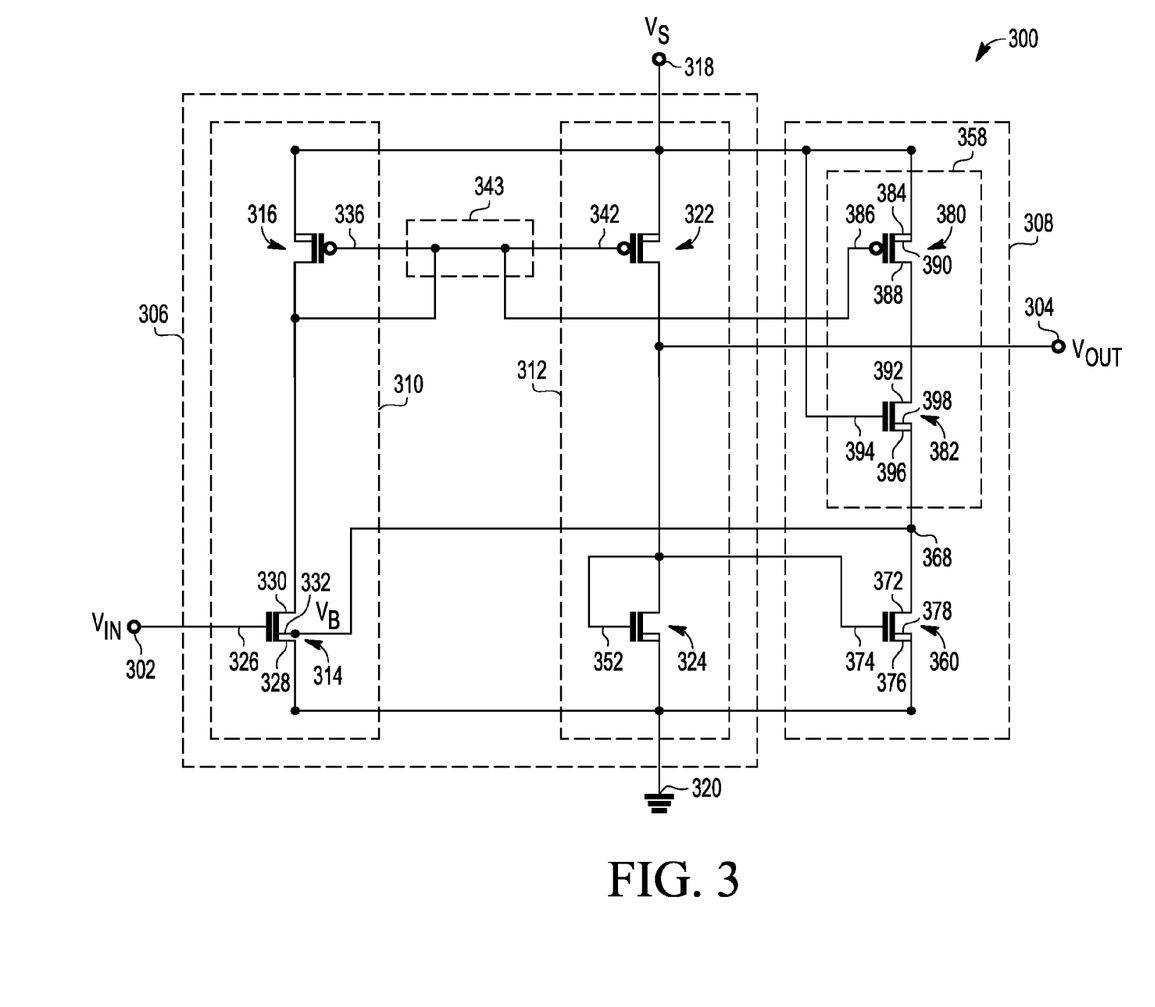
FIG. 3 is a schematic view of a voltage translation module suitable for use in the phase-locked loop system of FIG. 1 in accordance with another embodiment of the invention.

FIG. 3 depicts an exemplary embodiment of a voltage translation module 300 suitable for use as the voltage translation module 116 in the VCO module 106 of FIG. 1. In contrast to the voltage translation module 200 of FIG. 2, the voltage translation module 300 of FIG. 3 decreases the ratio of the output voltage to the input voltage, as described below. In an exemplary embodiment, the voltage translation module 300 includes, without limitation, an input node 302, an output node 304, voltage translation circuitry 306, and biasing circuitry 308. It should be noted that in the illustrated embodiment, the voltage translation circuitry 306 is configured in essentially the same manner as described above in the context of FIG. 2, and such description will not be redundantly described here in the context of FIG. 3. As described in greater detail below, the biasing circuitry 308 is coupled to the voltage translation circuitry 306 and decreases the ratio of the output voltage ($V_{OUT}$) to the input voltage ($V_{IN}$).

It should be understood that FIG. 3 is a simplified representation of a voltage translation module 300 for purposes of explanation and ease of description, and FIG. 3 is not intended to limit the application or scope of the subject matter in any way. In this regard, it should be noted that although FIG. 3 depicts an implementation using n-type MOSFETs (e.g., NMOS) and p-type MOSFETs (e.g., PMOS), numerous equivalent circuits may be implemented (e.g., using only NMOS or only PMOS). Additionally, although FIG. 3 depicts direct electrical connections between circuit elements and/or terminals, alternative embodiments may employ intervening circuit elements and/or components while functioning in a substantially similar manner.

As set forth above, in an exemplary embodiment, the voltage translation circuitry 306 comprises an input transistor stack 310 and an output transistor stack 312. The input transistor stack 310 comprises a first transistor 314 and a second transistor 316 coupled to each other in series between a supply node 318 and a ground node 320 and the output transistor stack 312 comprises a third transistor 322 and a fourth transistor 324 coupled to each other in series between the supply node 318 and the ground node 320 in a similar manner as set forth above in the context of FIG. 2.

In the illustrated embodiment of FIG. 3, the biasing circuitry 308 comprises a biasing transistor stack that includes a delay cell transistor stack 358 and a biasing transistor 360 configured in series between the supply node 318 and the ground node 320. In an exemplary embodiment, the biasing circuitry 308 is configured as a current mirror such that the current through the biasing transistor stack 308 is substantially equal to a ratio of the current through the input transistor stack 310 in a similar manner as set forth above. In an exemplary embodiment, biasing transistor stack 308 comprises a replica of a delay cell within a VCO (e.g., VCO 118) coupled to the output node 304, as described in greater detail below. In the illustrated embodiment, the delay cell transistor stack 358 comprises a PMOS transistor 380 and an NMOS transistor 382. The PMOS transistor 380 has a source terminal 384 coupled to the supply node 318 and a gate terminal 386 coupled to the common gate node 343. Alternatively, the gate terminal 386 may be referred to as being coupled to the gate terminal 336 of the second transistor 316, the gate terminal 342 of the third transistor 322, or the drain terminal 330 of the input transistor 314. The drain terminal 388 of the PMOS transistor 380 is coupled to the drain terminal 392 of the NMOS transistor 382. The body terminal 390 of the PMOS transistor 380 may be connected to its source terminal 384 and/or the supply node 318 as shown. The NMOS transistor 382 has a gate terminal 394 coupled to the supply node 318, and a source terminal 396 coupled to the bias node 368. In an exemplary embodiment, the biasing transistor 360 is realized as a NMOS device having a drain terminal 372 coupled to the bias node 368, a gate terminal 374 coupled to the output 304, and a source terminal 376 coupled to the ground node 320. As shown, the body terminal 378 of the biasing transistor 360 may be connected to its source terminal 376 and/or ground node 320.

Still referring to FIG. 3, an input voltage ($V_{IN}$) at the input node 302 that exceeds the threshold voltage of the input transistor 314 causes the input transistor 314 to conduct current and reduces the voltage at the drain terminal 330 (i.e., by reducing the drain-to-source voltage), which in turn reduces the voltage at the common gate node 343 (e.g., gate terminals 336, 342, 386) and causes current to flow through the input transistor stack 310. When the voltage at the gate terminal 342 of the third transistor 322 is reduced, the third transistor 322 conducts current and increases the voltage at the output node 304, which in turn, increases the voltage at the gate terminal 352 of the fourth transistor 324 resulting in current flow through the output transistor stack 312. In addition, when the voltage at the gate terminal 386 of the PMOS transistor 380 is reduced, the PMOS transistor 380 conducts current resulting in current flow through the biasing transistor stack 308. In the illustrated embodiment of FIG. 3, the bias voltage ($V_B$) at the bias node 368 is dependent on the drain-to-source voltage of the biasing transistor 360. In this regard, the voltage at the gate terminal 374 of the biasing transistor 360 (i.e., the output voltage ($V_{OUT}$) at the output node 304) establishes the gate-to-source voltage for the biasing transistor 360, which in turn affects the voltage at the drain terminal 372 (e.g., bias node 368) based on the and sizing and characteristics of the biasing transistor 360.

In an exemplary embodiment, the bias node 368 is connected to or otherwise fed back to the body terminal 332 of the input transistor 314, thereby allowing the biasing circuitry 308 to adjust the voltage at the body terminal 332 in response to the voltage at the input node 302. In this regard, when the input voltage ($V_{IN}$) exceeds the threshold voltage of the input transistor 314, the output voltage ($V_{OUT}$) at the output node 304 increases, as set forth above. As the output voltage ($V_{OUT}$) increases, the gate-to-source voltage for the biasing transistor 360 also increases, causing the biasing transistor 360 to source more current and thereby reducing the drain-to-source voltage across the biasing transistor 360 (i.e., the voltage at the drain terminal 372). As a result, the bias voltage ($V_B$) at the bias node 368 decreases as the output voltage ($V_{OUT}$) increases. It should be noted that the amount of the decrease in the bias voltage ($V_B$) will depend on the relationship between the device widths and/or other characteristics of the transistors 360, 380, 382 comprising the biasing circuitry 308.

A decrease in the voltage at the body terminal 332 of the input transistor 314 increases the threshold voltage of the input transistor 314, as will be appreciated in the art. As a result, for the same input voltage ($V_{IN}$), the ratio of the gate-to-source voltage for the input transistor 314 (e.g., the voltage at the gate terminal 326 when the source terminal 328 is grounded) to the threshold voltage of the input transistor 314 is decreased, thereby causing the input transistor 314 to source a lesser amount of current because the difference between the gate-to-source voltage (i.e., input voltage $V_{IN}$) and the threshold voltage is reduced. This, in turn, increases the drain-to-source voltage for the input transistor 314, that is, the voltage at its drain terminal 330 and/or common gate node 343 for the same input voltage ($V_{IN}$). A greater voltage at the common gate node 343 causes the third transistor 322 to source less current, which in turn, increases the source-to-drain voltage across the third transistor 322 and reduces the output voltage ($V_{OUT}$) at the output node 304. In other words, by virtue of the bias voltage ($V_B$) fed back to the body terminal 332 of the input transistor 314, the biasing circuitry 308 decreases the ratio of the output voltage ($V_{OUT}$) to the input voltage ($V_{IN}$), thereby causing the voltage translation module 300 to generate or otherwise produce a smaller output voltage ($V_{OUT}$) for a given input voltage ($V_{IN}$).

Referring now to FIG. 1 and FIG. 3, the voltage translation module 300 may be utilized in the VCO module 106 to compensate for PVT variations of the VCO 118 that would either result in oscillation frequencies of the VCO 118 that exceed the desired oscillation frequency range or prevent the VCO 118 from achieving the low-end of the desired oscillation frequency range. In this regard, PVT variations and/or other variations may effect the threshold voltages and/or time constants of the components of the VCO 118, and as a result, for a given control voltage, the VCO 118 may produce an oscillating signal with a frequency of oscillation that is greater than the intended frequency for the control voltage and/or reference voltage. For example, a reference voltage ($V_{REF}$) at the higher end of the reference voltage range may result in an oscillation frequency ($f_{OUT}$) that is too fast for the frequency divider 108, rendering the PLL 100 ineffective. As set forth above, the biasing circuitry 308 and/or bias voltage ($V_B$) at the body terminal 332 of the input transistor 314 decreases the ratio of the control voltage ($V_C$) to the reference voltage ($V_{REF}$) for the voltage translation module 116, 300, such that the voltage translation module 116, 300 generates or otherwise provides a smaller range of control voltages to the VCO 118 over the reference voltage range. As a result, the voltage translation module 116, 300 can limit the control voltages provided to the VCO 118 over the reference voltage range, thereby preventing the VCO module 106 from producing an oscillating signal having a frequency greater than the intended frequency range. It should be noted that as the control voltage ($V_C$) from the voltage translation module 116, 300 decreases for the same reference voltage ($V_{REF}$), the charge pump 112 and/or PLL 100 may compensate for the decreased ratio caused by the bias voltage ($V_B$) feedback by increasing the reference voltage ($V_{REF}$) to maintain a desired oscillation frequency for the output of the VCO module 106.

In addition, it should also be noted that in an exemplary embodiment where the biasing transistor stack 308 comprises a replica of a delay cell within the VCO 118, any PVT variations in the VCO 118 will also be reflected by the biasing transistor stack 308 of the voltage translation module 116, 300. For example, the VCO 118 may comprise a plurality of transistors arranged in a substantially identical manner as the biasing transistor stack 308 and suitably configured as a ring oscillator or another voltage-controllable oscillator. As a result, the biasing transistor stack 308 may experience PVT variations equivalent to PVT variations in the VCO 118. The improved matching properties of the biasing circuitry 308 to the VCO 118 enhance the ability of the biasing circuitry 308 to compensate for PVT variations of the VCO 118.

One advantage of the systems described above is that the VCO module in the PLL is self-adjusting, such that PVT variations within the VCO module do not impair the operability of the VCO module with the other elements of the PLL. The voltage translation module that translates reference voltages from the charge pump and/or forward path of the PLL to a control voltage is configured to adjust the ratio of the control voltage to reference voltage, such that the range of the control voltage is increased and/or decreased to compensate for any decrease and/or increase in the range of oscillation frequencies achievable by the VCO over the non-adjusted control voltage range. In addition, using feedback to adjust the gain of the voltage translation module provides control over dynamic behaviors of the PLL (e.g., stability, noise, etc.) which would otherwise be determined by transistor and/or component characteristics.

Systems, devices, and methods configured in accordance with example embodiments of the invention relate to:

An apparatus is provided for a voltage-controlled oscillator module. The voltage-controlled oscillator module comprises an input node for receiving an input voltage, a voltage-controlled oscillator, and voltage translation circuitry coupled between the input node and the voltage-controlled oscillator. The voltage translation circuitry is configured to generate a control voltage based on the input voltage and the voltage-controlled oscillator generates an oscillating signal at an oscillation frequency in response to the control voltage. Biasing circuitry is coupled to the voltage translation circuitry, and the biasing circuitry is configured to adjust the ratio of the control voltage to the input voltage. In accordance with one embodiment, the biasing circuitry is configured to increase the ratio of the control voltage to the input voltage. In accordance with another embodiment, the biasing circuitry is configured to decrease the ratio of the control voltage to the input voltage. In accordance with one or more embodiments, the voltage translation circuitry comprises a first transistor having a gate terminal coupled to the input node and a body terminal coupled to the biasing circuitry. In accordance with one embodiment, the biasing circuitry increases the ratio of the control voltage to the input voltage by increasing voltage at the body terminal of the first transistor. In an alternative embodiment, the biasing circuitry decreases the ratio of the control voltage to the input voltage by decreasing a biasing voltage at the body terminal of the first transistor.

In accordance with another embodiment, an apparatus is provided for a voltage translation module. In an exemplary embodiment, the voltage translation module comprises an input node, an output node, a first transistor stack coupled to the input node, a second transistor stack coupled to the first transistor stack and the output node, and a third transistor stack coupled to the first transistor stack. The first transistor stack comprises a first transistor having a gate terminal coupled to the input node. The second transistor stack is configured as a current mirror for the first transistor stack. The third transistor stack is configured as a current mirror for the first transistor stack and establishes a bias node coupled to a body terminal of the first transistor. In accordance with one or more embodiments, the input node is configured to receive an input voltage which results in an output voltage at the output node, wherein the second transistor stack is configured such that an increase in the input voltage results in a corresponding increase in the output voltage at the output node. In a further embodiment, the third transistor stack is configured to increase voltage at the body terminal of the first transistor in response to the input voltage, wherein a ratio of the output voltage to the input voltage increases in response to increased voltage at the body terminal of the first transistor. In an alternative embodiment, the third transistor stack is configured to decrease voltage at the body terminal of the first transistor in response to the input voltage, wherein a ratio of the output voltage to the input voltage decreases in response to decreased voltage at the body terminal of the first transistor.

In accordance with one or more embodiments, the voltage translation module further comprises a first reference node and a second reference node. The first transistor has a source terminal coupled to the second reference node and the first transistor stack further comprises a second transistor. The second transistor has a drain terminal coupled to a drain terminal of the first transistor, a gate terminal coupled to the drain terminal of the first transistor, and a source terminal coupled to the first reference node. The second transistor stack comprises a third transistor having a source terminal coupled to the first reference node, a gate terminal coupled to the gate terminal of the second transistor, and a drain terminal coupled to the output node, and a fourth transistor having a drain terminal coupled to the output node, a gate terminal coupled to the output node, and a source terminal coupled to the second reference node. In accordance with one embodiment, the third transistor stack comprises a fifth transistor having a source terminal coupled to the first reference node, a gate terminal coupled to the gate terminal of the second transistor, and a drain terminal coupled to the bias node, and a sixth transistor having a drain terminal coupled to the bias node, a gate terminal coupled to the bias node, and a source terminal coupled to the second reference node. In an alternative embodiment, the third transistor stack comprises a delay cell of a voltage controlled oscillator coupled to the output node. In accordance with another embodiment, the first transistor comprises a thick oxide device.

In yet another embodiment, an apparatus is provided for a phase-locked loop. The phase-locked loop comprises a forward signal path, a voltage translation module, and a voltage-controlled oscillator. The forward signal path generates a reference voltage based on a difference between a reference signal having a reference frequency and an oscillating signal having an oscillation frequency. The voltage translation module is coupled to the forward signal path, and the voltage translation module is configured to generate a control voltage based on the reference voltage, wherein the ratio of the control voltage to the reference voltage is adjusted based on the reference voltage. The voltage-controlled oscillator is coupled to the voltage translation module and the forward signal path, and the voltage-controlled oscillator is configured to generate the oscillating signal at the oscillation frequency based on the control voltage. In accordance with one or more embodiments, voltage translation module comprises voltage translation circuitry and biasing circuitry. The voltage translation circuitry is coupled to the forward signal path and the voltage-controlled oscillator, and the voltage translation circuitry generates the control voltage based on the reference voltage. The biasing circuitry is configured to adjust the ratio of the control voltage to the reference voltage based on the reference voltage. In a further embodiment, the voltage translation circuitry comprises an input transistor having a gate terminal configured to receive the reference voltage, wherein the biasing circuitry is coupled to the input transistor and configured to adjust the ratio of the control voltage to the reference voltage by providing a bias voltage to a body terminal of the input transistor. In accordance with one embodiment, the biasing circuitry is configured increase the ratio of the control voltage to the reference voltage by increasing the bias voltage based on the reference voltage. In an alternative embodiment, the biasing circuitry is configured decrease the ratio of the control voltage to the reference voltage by decreasing the bias voltage based on the control voltage. In yet another embodiment, the voltage-controlled oscillator comprises a plurality of delay cells and the biasing circuitry comprises a replica of a delay cell of the voltage-controlled oscillator.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A voltage-controlled oscillator module comprising:
   an input node for receiving an input voltage;
   a voltage-controlled oscillator configured to generate an oscillating signal at an oscillation frequency in response to a control voltage;
   voltage translation circuitry coupled between the input node and the voltage-controlled oscillator, the voltage translation circuitry being configured to generate the control voltage based on the input voltage; and
   biasing circuitry coupled to the voltage translation circuitry, the biasing circuitry being configured to adjust the ratio of the control voltage to the input voltage.

2. The voltage-controlled oscillator module of claim 1, wherein the biasing circuitry is configured to increase the ratio of the control voltage to the input voltage.

3. The voltage-controlled oscillator module of claim 1, wherein the biasing circuitry is configured to decrease the ratio of the control voltage to the input voltage.

4. The voltage-controlled oscillator module of claim 1, wherein the voltage translation circuitry comprises a first transistor having a gate terminal coupled to the input node and a body terminal coupled to the biasing circuitry.

5. The voltage-controlled oscillator module of claim 4, wherein the biasing circuitry increases the ratio of the control voltage to the input voltage by increasing voltage at the body terminal of the first transistor.

6. The voltage-controlled oscillator module of claim 4, wherein the biasing circuitry decreases the ratio of the control voltage to the input voltage by decreasing a biasing voltage at the body terminal of the first transistor.

7. A voltage translation module comprising:
   an input node;
   an output node;
   a first transistor stack coupled to the input node, the first transistor stack comprising a first transistor having a gate terminal coupled to the input node;
   a second transistor stack coupled to the first transistor stack and the output node, the second transistor stack being configured as a current mirror for the first transistor stack; and
   a third transistor stack coupled to the first transistor stack, the third transistor stack being configured as a current mirror for the first transistor stack, wherein the third transistor stack establishes a bias node coupled to a body terminal of the first transistor.

8. The voltage translation module of claim 7, the input node being configured to receive an input voltage, the input voltage resulting in an output voltage at the output node, wherein the second transistor stack is configured such that an increase in the input voltage results in a corresponding increase in the output voltage at the output node.

9. The voltage translation module of claim 8, wherein the third transistor stack is configured to increase voltage at the body terminal of the first transistor in response to the input voltage, wherein a ratio of the output voltage to the input voltage increases in response to increased voltage at the body terminal of the first transistor.

10. The voltage translation module of claim 8, wherein the third transistor stack is configured to decrease voltage at the body terminal of the first transistor in response to the input voltage, wherein a ratio of the output voltage to the input voltage decreases in response to decreased voltage at the body terminal of the first transistor.

11. The voltage translation module of claim 7, further comprising:
   a first reference node; and
   a second reference node, wherein:
     the first transistor has a source terminal coupled to the second reference node;
     the first transistor stack further comprises a second transistor, the second transistor having a drain terminal coupled to a drain terminal of the first transistor, a gate terminal coupled to the drain terminal of the first transistor, and a source terminal coupled to the first reference node; and
     the second transistor stack comprises:
       a third transistor having a source terminal coupled to the first reference node, a gate terminal coupled to the gate terminal of the second transistor, and a drain terminal coupled to the output node; and
       a fourth transistor having a drain terminal coupled to the output node, a gate terminal coupled to the output node, and a source terminal coupled to the second reference node.

12. The voltage translation module of claim 11, wherein the third transistor stack comprises:
   a fifth transistor having a source terminal coupled to the first reference node, a gate terminal coupled to the gate terminal of the second transistor, and a drain terminal coupled to the bias node; and
   a sixth transistor having a drain terminal coupled to the bias node, a gate terminal coupled to the bias node, and a source terminal coupled to the second reference node.

13. The voltage translation module of claim 7, wherein the third transistor stack comprises a replica of a delay cell of a voltage controlled oscillator coupled to the output node.

14. The voltage translation module of claim 7, wherein the first transistor comprises a thick oxide device.

15. A phase-locked loop comprising:
   a forward signal path configured to generate a reference voltage based on a difference between a reference signal having a reference frequency and an oscillating signal having an oscillation frequency;
   a voltage translation module coupled to the forward signal path, the voltage translation module being configured to generate a control voltage based on the reference voltage, wherein the ratio of the control voltage to the reference voltage is adjusted based on the reference voltage; and
   a voltage-controlled oscillator coupled to the voltage translation module and the forward signal path, the voltage-controlled oscillator being configured to generate the oscillating signal at the oscillation frequency based on the control voltage.

16. The phase-locked loop of claim 15, wherein the voltage translation module comprises:
   voltage translation circuitry coupled to the forward signal path and the voltage-controlled oscillator, the voltage translation circuitry being configured to generate the control voltage based on the reference voltage; and
   biasing circuitry coupled to the voltage translation circuitry, the biasing circuitry being configured to adjust the ratio of the control voltage to the reference voltage based on the reference voltage.

17. The phase-locked loop of claim 16, wherein the voltage translation circuitry comprises an input transistor having a gate terminal configured to receive the reference voltage, wherein the biasing circuitry is configured to adjust the ratio of the control voltage to the reference voltage by providing a bias voltage to a body terminal of the input transistor.

18. The phase-locked loop of claim 17, wherein the biasing circuitry is configured increase the ratio of the control voltage to the reference voltage by increasing the bias voltage based on the reference voltage.

19. The phase-locked loop of claim 17, wherein the biasing circuitry is configured decrease the ratio of the control voltage to the reference voltage by decreasing the bias voltage based on the control voltage.

20. The phase-locked loop of claim 16, wherein:
   the voltage-controlled oscillator comprises a plurality of delay cells; and
   the biasing circuitry comprises a replica of a delay cell of the voltage-controlled oscillator.

* * * * *